(12) United States Patent
Einav

(10) Patent No.: US 8,846,505 B2
(45) Date of Patent: Sep. 30, 2014

(54) METHOD OF GROWING SEMICONDUCTOR MICRO-CRYSTALLINE ISLANDS ON AN AMORPHOUS SUBSTRATE

(75) Inventor: Moshe Einav, Kfar Uriyah (IL)

(73) Assignee: SKOKIE Swift Corporation, Silver Spring, MD (US)

( * ) Notice: Subject to any disclaimer, the term of this patent is extended or adjusted under 35 U.S.C. 154(b) by 727 days.

(21) Appl. No.: 12/720,399

(22) Filed: Mar. 9, 2010

(65) Prior Publication Data

US 2010/0227456 A1 Sep. 9, 2010

Related U.S. Application Data

(60) Provisional application No. 61/158,523, filed on Mar. 9, 2009.

(51) Int. Cl.
H01L 21/36 (2006.01)

(52) U.S. Cl.
USPC ........... 438/486; 438/487; 438/500; 438/502; 257/E21.133; 257/E21.134; 117/16; 117/19; 117/68; 117/73; 117/78; 117/79; 117/81

(58) Field of Classification Search
USPC ................ 438/497, 500, 502, 509, 486, 487; 257/70, 75, E21.114, E21.133, 257/E21.134; 117/16, 19, 73, 78, 79, 81, 68
See application file for complete search history.

(56) References Cited

U.S. PATENT DOCUMENTS

| | | | |
|---|---|---|---|
| 4,771,016 A | 9/1988 | Bajor et al. | |
| 5,061,642 A | 10/1991 | Fujioka | |
| 5,417,180 A | 5/1995 | Nakamura | |
| 6,255,147 B1 * | 7/2001 | Buynoski | 438/164 |
| 2002/0038889 A1 * | 4/2002 | Yamazaki et al. | 257/347 |
| 2002/0160553 A1 * | 10/2002 | Yamanaka et al. | 438/149 |
| 2003/0129853 A1 * | 7/2003 | Nakajima et al. | 438/795 |
| 2006/0172469 A1 * | 8/2006 | Lin et al. | 438/149 |
| 2009/0191670 A1 * | 7/2009 | Heitzinger et al. | 438/151 |

\* cited by examiner

Primary Examiner — Kimberly Rizkallah
Assistant Examiner — Maria Ligai
(74) Attorney, Agent, or Firm — Merchant & Gould P.C.

(57) ABSTRACT

A method for growing islands of semiconductor monocrystals from a solution on an amorphous substrate includes the procedures of depositing a semiconductor-metal mixture layer, applying lithography and etching for forming at least one platform, heating the at least one platform, and saturating the semiconductor-metal solution until a monocrystal of the semiconductor component is formed. The procedure of depositing a semiconductor-metal mixture layer, includes a semiconductor component and at least one other metal component, is performed on top of the amorphous substrate. The procedure of applying lithography and etching to the semiconductor-metal mixture layer and a portion of the amorphous substrate is performed for forming at least one platform, the at least one platform having a top view shape corresponding to crystal growth direction and habit respective of the semiconductor component. The procedure of heating the at least one platform is performed until the semiconductor-metal mixture layer of the at least one platform is melted and becomes a semiconductor-metal solution. The procedure of saturating the semiconductor-metal solution is performed until a monocrystal of the semiconductor component is formed from the solution on each of the at least one platform.

15 Claims, 4 Drawing Sheets

METHOD OF GROWING SEMICONDUCTOR MICRO-CRYSTALLINE ISLANDS ON AN AMORPHOUS SUBSTRATE

This application claims benefit of U.S. Ser. No. 61/158,523, filed 9 Mar. 2009 and which application is incorporated herein by reference. To the extent appropriate, a claim of priority is made to the above disclosed application.

FIELD OF THE DISCLOSED TECHNIQUE

The disclosed technique relates to growing semiconductor micro-crystalline islands on an amorphous substrate, in general, and to methods for growing silicon micro-crystalline islands on an amorphous silicon-dioxide substrate, in particular.

BACKGROUND OF THE DISCLOSED TECHNIQUE

The term "Silicon on Insulator" (SOI) refers to the use of a layered silicon-insulator-silicon substrate instead of standard silicon substrate in semiconductor industry. SOI structure reduces parasitic capacitance, resists latch up and thereby improves device performance.

Methods for producing SOI wafers are known in the art. A first example of a method for producing SOI wafers is, Separation by Implantation of Oxygen (SIMOX), in which a buried silicon oxide layer is created by implanting oxygen ions under the surface of the substrate and annealing the substrate in high temperature. A second example of a method for producing SOI wafers is, directly bonding an oxidized face of first silicon wafer to a second wafer (i.e., wafer bonding method), followed by the release of the first silicon wafer. A third example of a method for producing SOI wafers is, growing a silicon crystal directly on an overgrown oxide (i.e., the seed method) by digging a pit in the oxide until reaching the underlying crystal. Then, the deposition of epitaxial silicon will firstly fill the pit vertically, continuing then-after with lateral overgrowth onto the oxide. All the methods detailed in the above examples are costly, and enable the production of a single active layer on top of the oxide (i.e., insulator).

Reference is now made to U.S. Pat. No. 5,061,642 to Fujioka, entitled "Method of Manufacturing Semiconductor on Insulator", which is directed to a method for forming SOI structure by Separation by Implanted Oxygen (SIMOX). The SIMOX method includes the procedures of oxygen ions are implanted to the surface of a silicon substrate, and the substrate is subjected to heat cycle annealing. As a result of the annealing, a Si single crystal layer is formed in the top region of the surface of the substrate and an SiO2 layer is formed just underneath the Si layer. The method further includes the procedures of implanting Boron ions in the substrate and forming source and drain electrodes by implanting arsenic ions in the substrate.

Reference is now made to U.S. Pat. No. 4,771,016 to Bajor et al., entitled "Using a Rapid Thermal Process for Manufacturing a Wafer Bonded SOI Semiconductor", which is directed to a method for forming silicon on insulator semiconductor device using wafer bonding. The method includes the procedures of providing a first layer of semiconductor material formed on a first support structure, providing a second layer of an insulating material formed on a handle wafer, engaging the top surface of the first layer with the top surface of the second layer, and bonding the first support structure to the handle wafer. The first layer of semiconductor device has an exposed top surface. The second layer of an insulating material has an exposed top surface. The bonding is achieved by annealing the first layer and the second layer using a rapid thermal process. The method further includes the procedure of removing the support structure from the first layer of semiconductor material.

Reference is now made to U.S. Pat. No. 5,417,180 to Nakamura, entitled "Method for Forming SOI Structure", which is directed to a method for forming an SOI structure. The method includes the procedures of forming an insulating layer (i.e., by oxidizing a silicon layer) and providing the insulating layer with an opening down to the silicon surface. The method further includes the procedure of epitaxially growing a seed crystal within the opening until the depth of the seed crystal layer substantially reaches the depth of the opening. The method continues with the procedures of forming a growth blocking layer on a top surface of the seed crystal layer (i.e., by nitrifying the seed crystal layer), and laterally epitaxially growing the seed crystal layer on top of the insulating layer.

SUMMARY OF THE PRESENT DISCLOSED TECHNIQUE

It is an object of the disclosed technique to provide a novel Method and system for growing islands of perfect micro crystals on essentially any substrate having an amorphous surface layer. In accordance with the disclosed technique, there is thus provided a method for growing islands of semiconductor monocrystal from a solution on an amorphous substrate. The method includes the procedures of depositing a semiconductor-metal mixture layer and applying lithography and etching for forming at least one platform which is covered with the mixture. The method further includes the procedures of heating and melting the covered platform for forming a solution from the semiconductor-metal mixture, and saturating the semiconductor-metal solution until a monocrystal of the semiconductor component is formed. The procedure of depositing a semiconductor-metal mixture layer is performed on top of the amorphous substrate. The semiconductor-metal mixture layer includes a semiconductor component and at least one other metal component. The lithography and etching are applied to the semiconductor-metal mixture layer and a portion of the amorphous substrate, for forming at least one platform. Each of these platforms has a top view shape corresponding to crystal growth direction and habit respective of the semiconductor component crystallography. The procedure of heating these platforms is performed until the semiconductor-metal mixture layer of the respective platform is melted and becomes a semiconductor-metal solution. The semiconductor-metal solution is saturated until a monocrystal of the semiconductor component is formed from the solution on each of the platforms.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

The disclosed technique overcomes the disadvantages of the prior art by providing a novel method for growing silicon (herein abbreviated Si) micro-crystalline islands from a solution, on an amorphous silicon dioxide (herein abbreviated $SiO_2$) substrate. The disclosed technique enables producing a multi-story active device structure (i.e., Manhattan type of chip). The silicon micro-crystalline islands are grown on the surface of shaped $SiO_2$ platform structures (i.e., podiums). The geometric shape of the top surface of each of the platforms corresponds to the growth direction, the habit and the onset of growth of the micro-crystals (e.g., Si micro-crystals have crystallographic growth direction of [111] on $SiO_2$, and a parallelogram habit of 60-120° degrees).

Figure 1A:
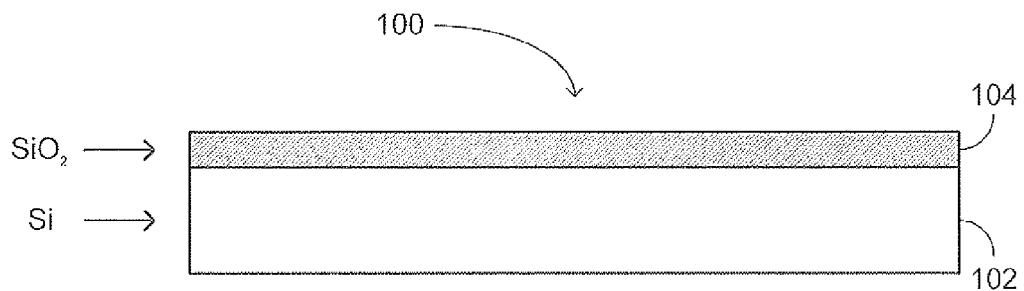
FIGS. 1A, 1B, 1C, 1D, 1E, and 1F are schematic illustrations of various procedures in growing semi-conductor micro-crystalline islands on an amorphous substrate wafer, constructed and operative in accordance with an embodiment of the disclosed technique.

The term "micro-crystalline island" as detailed herein below, refers to a single semiconductor micro-crystal grown from a solution of semiconductor and at least one other metal component. Reference is now made to FIG. 1A, which is a schematic illustration of a first procedure in growing semiconductor micro-crystalline islands on an amorphous substrate, generally referenced 100, constructed and operative in accordance with an embodiment of the disclosed technique. In general, micro-crystals are grown on a substrate. In the example set forth in FIG. 1A, a substrate of silicon 102 is used upon which silicon micro-crystalline islands will be grown. Substrate 102 does not have a particular crystallographic function in relation to the silicon micro-crystalline islands which will be grown on top thereof. Substrate 102 functions as a mechanical support for the silicon micro-crystalline islands.

A layer of silicon dioxide ($SiO_2$) 104 is grown on top of substrate 102. Layer of $SiO_2$ 104 is grown by one of a variety of methods such as thermal oxidation of substrate 102, spin-on glass, Tetraethyl Orthosilicate (TEOS) Chemical Vapor Deposition (CVD), silane and oxygen plasma enhanced CVD, sputtering and the like. Substrate 102 and layer of $SiO_2$ 104 together represent wafer 100 which enters a system (not shown) for growing thin film crystals. It is noted that, layer of $SiO_2$ 104 is an amorphous layer which does not impose any crystallographic restrictions (i.e., no crystallographic effect) on a micro-crystal grown thereupon. It is further noted that, albeit the crystal does not grow on a native crystalline template, it is essentially Homo-nucleated from the solution rather than Hetero-nucleated on a foreign substrate. Throughout FIGS. 1A to 1F, the same numbers are used to indicate substantially similar elements in the crystal growth process.

Figure 1B:
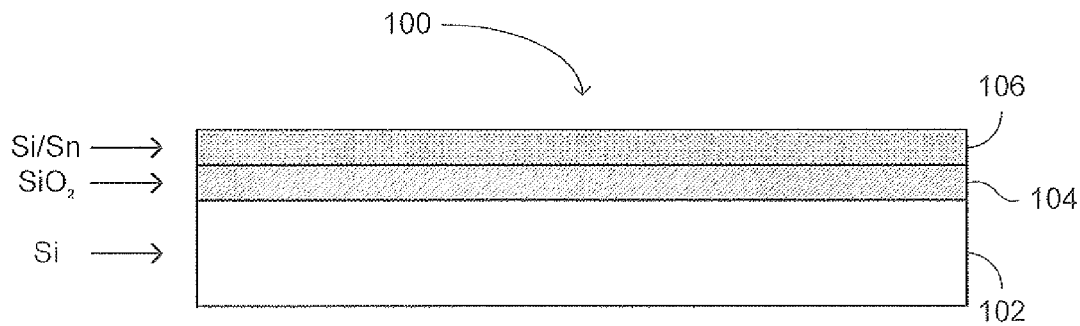

Reference is now made to FIG. 1B, which is a schematic illustration of a second procedure in growing semiconductor micro-crystalline islands on an amorphous substrate, generally referenced 100, constructed and operative in accordance with an embodiment of the disclosed technique. In this procedure, a layer of silicon-tin (herein abbreviated Si/Sn) mixture 106, having a thickness of approximately one half the typical lateral dimension of the micro-crystalline island to be grown, is deposited on top of layer of $SiO_2$ 104. For example, for a micro-crystalline island having a typical crystalline dimension of 60 nm, the thickness of the deposited Si/Sn mixture would be 30 nm. Layer of Si/Sn mixture 106 is deposited by subjecting substrate 102 and layer of $SiO_2$ 104 to Si/Sn vapor at relatively low temperature.

Low temperature deposition prevents the formation of droplets within Si/Sn mixture layer 106. When substrate 102 is hotter than a predetermined temperature (i.e., the temperature of the low temperature deposition), it enables incoming metal atoms to diffuse and drift around. These atoms coalesce and form droplets. Every metal (e.g., Tin) has a predetermined temperature for droplets formation and the deposition of the mixture (i.e., the mixture of layer 106) should thus be at a lower temperature than that predetermined temperature. The top surface of Si/Sn mixture layer 106 is substantially smooth in the nano-scale level (i.e., smooth enough for enabling photolithography of Si/Sn mixture layer 106). Layer of Si/Sn mixture 106 is substantially an amorphous "snow like" solid mixture (i.e., having low density and being an immobile solid mixture) having a molar concentration of approximately 10% silicon and 90% tin (i.e., 1-20% Si and 80-99% Sn).

The concentration of the semiconductor component of the mixture (e.g., Si/Sn mixture 106) is determined according to the desired final thickness of the semiconductor crystalline island and according to the desired crystallization temperature for that mixture. It is noted that, the term "semiconductor-metal solution" is used interchangeably with the term "semiconductor-metal mixture" (since the semiconductor-metal mixture is transformed into the semiconductor solution upon melting). The concentration and temperature of a semiconductor solute (e.g., Si) and a metal solvent (e.g., Sn) solution determine the saturation point of the solution. The saturation point is the maximal concentration of solute which the solvent can dissolve at certain temperature. When the saturation point is reached by lowering the temperature, solute molecules start to solidify (i.e., crystallize). As the temperature of the solution raises, the solvent can dissolve more solute (i.e., the saturation point increases with temperature). When cooling a purely liquid solution, the saturation point can be reached and crystals begin to form. By determining the temperature, one can determine the saturation concentration of the solute. For example, low solute concentration enables low crystal growth temperature and low thickness of the crystal. High solute concentration enables faster crystal growth at high temperature which can result in a larger quantity of crystal defects.

The considerations affecting the choice of the metal solvent of the semiconductor solution are crystal electronic defects, introduced by the metal atoms (i.e., inclusions) when dissolved within the semiconductor, high solvation capacity, low melting temperature, costs and toxicity of the metal solvent. For example, gallium can solvate silicon easier than tin, but tin does not introduce harmful electronic impurities to silicon as does gallium. Therefore, it may be preferable to employ a silicon-tin solution, rather than a silicon-gallium solution.

Figure 1C:
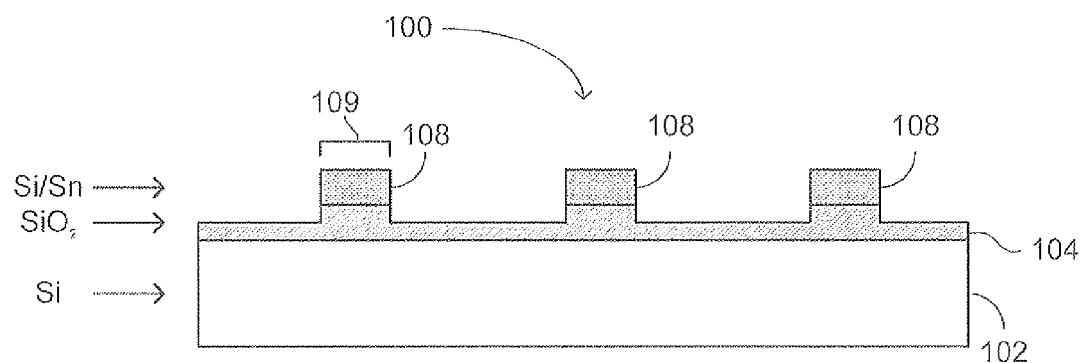

Reference is now made to FIG. 1C, which is a schematic illustration of a third procedure in growing semiconductor micro-crystalline islands on an amorphous substrate, generally referenced 100, constructed and operative in accordance with an embodiment of the disclosed technique. In this procedure, layer of Si/Sn 106 and layer of $SiO_2$ 104 are etched for forming Si/Sn platforms 108 comprising of SiO2 podium and a Si/Sn mixture on top. Si/Sn platforms 108 can be formed by a process of lithography and etching, as is known in the art.

The width of each Si/Sn platform 108, designated by a line 109, is between 5 nm and 500 nm. The location of Si/Sn platforms 108 determines the position of electronic devices or components, such as Field Effect Transistors (FETs), Thin Film Transistor (TFT), diode, photodiode, light emitting diode, photo-transistor, micro-electro-mechanical (MEM), Laser-diode, photovoltaic cell, whisker, quantum dot, and the like, on wafer 100. Additionally, the top surface geometry (i.e., the geometry of the platforms as seen from a top view perspective) of the platforms is determined according to the growth direction of the micro-crystals, the desired onset of growing and the habit. The habit of a crystal is its typical geometric appearance. Crystals which grow on an amorphous substrate, generally have a [111] growth direction and a parallelogram shape habit.

In the example set forth in FIGS. 1B and 1C the semiconductor-metal mixture (to be a solution after melting) includes a silicon solute component and a Tin metal solvent component at the concentration range of 1-20% of Si and 99-80% of Sn. Another example of a semiconductor solution is a Gallium Nitride (i.e., GaN—semiconductor solute) and Gallium (i.e., Ga—metal solvent) solution. In the example of the GaN/Ga solution, the first step is depositing a solid amorphous layer of Ga at sub-room temperature (e.g., minus 10° C.). The next step is lithography and etching of the Ga layer in a similar manner to the lithography and etching detailed with reference to FIG. 1C. The following step is heating the Ga layer to a high temperature (e.g., 850° C.) until droplets of Ga are formed and the native $Ga_2O$ oxide escapes from the droplets surface, and applying either ammonia or nitrogen plasma for receiving gallium nitride. The active nitrogen reacts with gallium metal atoms on the surface of each of the droplets and forms GaN molecules (i.e., the semiconductor component of the semiconductor solution). The GaN molecules diffuse to the bulk of the Ga droplet, and a solution of GaN/Ga is formed. When the GaN/Ga solution reaches the saturation point, it casts out a seed of a crystalline GaN. Once the GaN crystallite is grown, the solvent (i.e., Ga) is disposed of. The concentrations of the GaN component and the Ga component vary with time, as GaN molecules are formed and Ga atoms disappear (i.e., Ga atoms move from the solvent metal component to the solute semiconductor component).

Figure 1D:
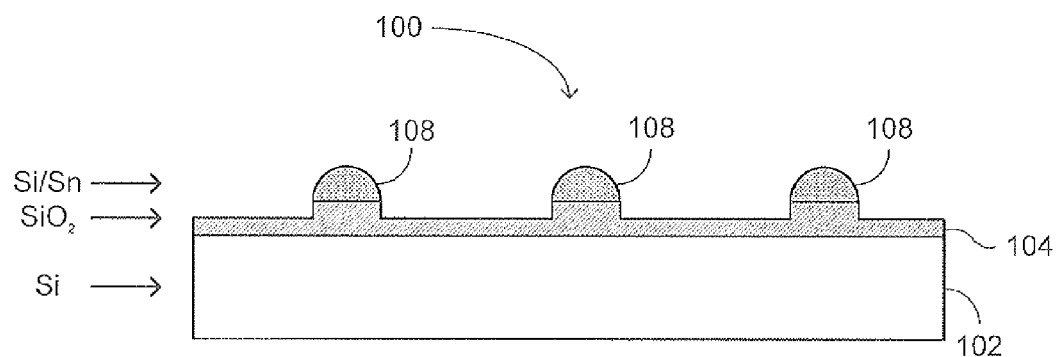

Reference is now made to FIG. 1D, which is a schematic illustration of a fourth procedure in growing semiconductor micro-crystalline islands on an amorphous substrate, generally referenced 100, constructed and operative in accordance with an embodiment of the disclosed technique. In this procedure, wafer 100 is heated to a temperature of 700° C. As the melting point of tin is approximately 230° C., the prismatic shape of platforms 108, which are composed of amorphous solid mixture of silicon and tin, changes into a spherical liquid droplet. At 230° C. the tin component can dissolve only a minute fraction of the Si component. As the temperature rises, more Si is dissolved and according to phase diagram, at liquidus temperature, which at the example set forth before is 700° C., all Si is dissolved and a pure liquid solution 108 is formed. Si/Sn solution 108 is homogenized by further soaking at the Liquidus Temperature for some time.

Figure 1E:
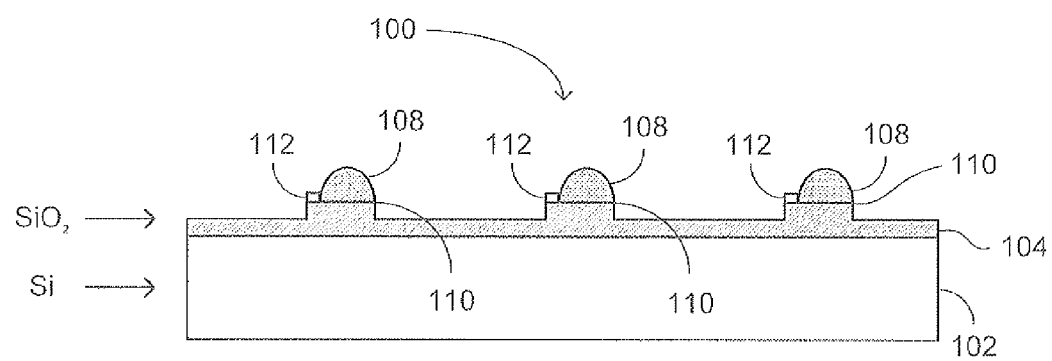

Reference is now made to FIG. 1E, which is a schematic illustration of a fifth procedure in growing semiconductor micro-crystalline islands on an amorphous substrate, generally referenced 100, constructed and operative in accordance with an embodiment of the disclosed technique. At this stage, Si/Sn liquid solution 108 is saturated, and the Si component starts to solidify (i.e., crystallize). A Si seed 112 is formed at the tip of each of a plurality of platforms 110 (at the location detailed further with reference to FIG. 2) aside the droplet of Si/Sn liquid solution 108.

There are various ways to saturate Si/Sn liquidus solution 108. A first example of a way to saturate solution 108 is by cooling down solution 108. It is noted that, the cooling rate increases with the size of the Si crystal, for a given crystal quality. A second example of a way to saturate solution 108 is by maintaining solution 108 at the soaking temperature such that the Tin component evaporates and solution 108 becomes saturated. A third example of a way to saturate solution 108 is by disposing of the solvent (i.e., the Tin component) by employing a chemical substance (e.g., Iodine) which reacts with the solvent and escapes the system. For example, Tin Iodide escapes solution 108 as a gas.

Figure 1F:
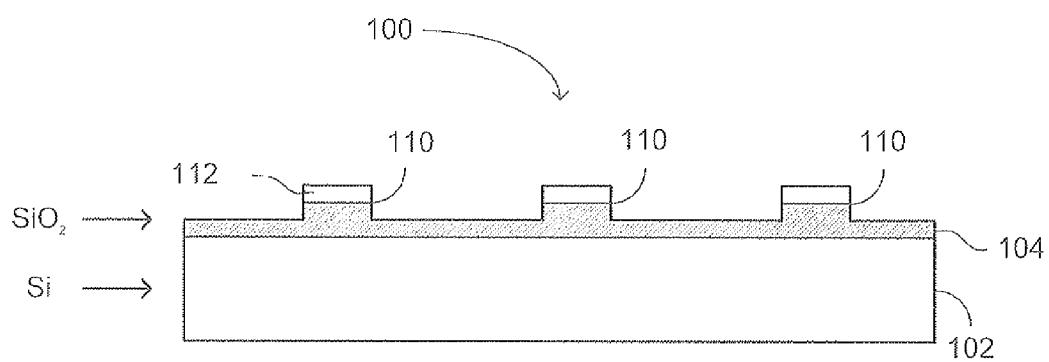

Reference is now made to FIG. 1F, which is a schematic illustration of a sixth procedure in growing semiconductor micro-crystalline islands on an amorphous substrate, generally referenced 100, constructed and operative in accordance with an embodiment of the disclosed technique. In this procedure, the desired microcrystalline island is grown from the solution. The tin solvent, which did not escape the system, is disposed of by evaporation, by chemical reaction, or by chemically dissolving it with an acidic aqueous solution which do not dissolve the grown crystal (e.g., hydrogen chloride—HCl). Each platform 110 is now composed of a layer of $SiO_2$ 104, followed by a layer of a silicon monocrystal 112. It is noted that each platform 110 has a flat Si monocrystal grown there upon. Si monocrystal 112 has a [111] growth direction and a typical parallelogram shape habit. In the example set forth in FIGS. 1A to 1F, Si micro-crystalline islands are grown. Alternatively, other types of semiconductor micro-crystalline islands may be grown, such as silicon, germanium, silicon carbide, silicon germanium, mercury iodide, zinc oxide, zinc sulphide, zinc selenide, zinc telluride, cadmium (VI), zinc cadmium (VI), gallium arsenide, gallium aluminum arsenide, gallium phosphide, indium phosphide, aluminium nitride, gallium nitride, indium nitride, indium gallium nitride, indium gallium aluminum nitride, Gallium antimonide, Indium antimonide, and the like. Further alternatively, other amorphous materials may be employed as substrates, such as silicon-dioxide ($SiO_2$), silicon nitride, silicon oxy-nitride, indium tin oxide, zinc oxide, glass, glass on metal, amorphous metal, ceramic substrate, glass on crystal, and any combination thereof. It is noted that being amorphous, these substrates are easily formed on any preceding active layer for forming a multi-story structure of active devices. Moreover, each story can accommodate a different sort of semiconductor material micro-crystals. It is further noted that, crystals grown on amorphous substrates have the parallelogram shape habit with angles of 60-120 degrees extending from the same edge. These crystals grow in the [111] crystallographic direction.

Figure 2A:
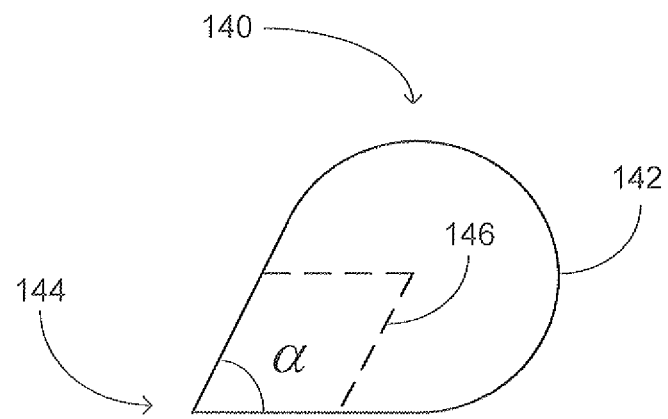
FIGS. 2A, and 2B are schematic illustrations of a teardrop-shaped platform for growing a micro-crystalline island thereupon, constructed and operative in accordance with another embodiment of the disclosed technique.
Figure 2B:
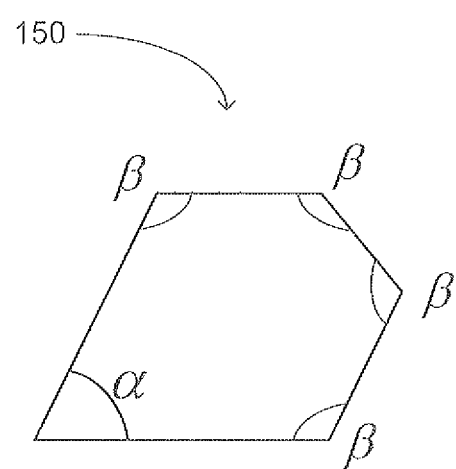

Reference is now made to FIGS. 2A and 2B, which are schematic illustrations of a top view of a teardrop-shaped platform, generally referenced 140, for growing micro-crystalline islands thereupon, constructed and operative in accordance with another embodiment of the disclosed technique. With reference to FIG. 2A, Teardrop platform 140 includes a teardrop-shaped body 142 and a teardrop tip 144. The top surface geometry (i.e., the geometry as seen from the top view perspective) of teardrop platform 140 is determined by lithography and etching such that it facilitates crystal growth. It is noted that, teardrop platform 140 is similar to platform 108 of FIG. 1C. The geometry of platform 140 determines the onset of crystallization of a micro-crystal thereupon (e.g., microcrystal 112 of FIG. 1F). Specifically, since teardrop tip 144 is the first portion of platform 140 to cool down (i.e., it is the fastest heat emitting surface of platform 140 since it has the largest surface to volume ratio), tip 144 would be the seeding site (i.e., starting point) of crystallization of the micro-crystalline island. It is noted that, the teardrop shape of platform 140 is an ideal shape. In order to achieve crystallization at tip 144, platform 144 can be of a simpler shape, such as any polygon, in which the single sharpest angle is an approximately 60 degrees angle. Another example of a possible top surface shape for platform 140, is any shape having a tip angle of 60 degrees and no other sharper tips. Yet another example is any polygon having a single acute angle and a plurality of obtuse angles.

With reference to FIG. 2B, platform 150 is an example of a top view geometry for a platform (e.g., platform 110 of FIG. 1D) for growing micro-crystalline island there upon. The top view geometry of platform 150 is in the shape of a pentagon having a single 60° angle (i.e., angle α) and four 120° angles (i.e., angles β). Platform 150 is substantially similar to platform 140 of FIG. 2A. Platform 150 is easier to shape through lithography and etching than platform 140 of FIG. 2A since platform 150 is formed by straight sides.

In the example set forth in FIG. 2A, teardrop tip 144 is an angle of 60 degrees. The 60 degrees angle of tip 144 is compatible with the [111] growth direction of certain crystals, for example, a silicon crystal and a gallium nitride crystal. Rhombus 146 is a silicon micro-crystal, substantially similar to micro-crystal 112 of FIG. 1F, grown on platform 140.

Figure 3:
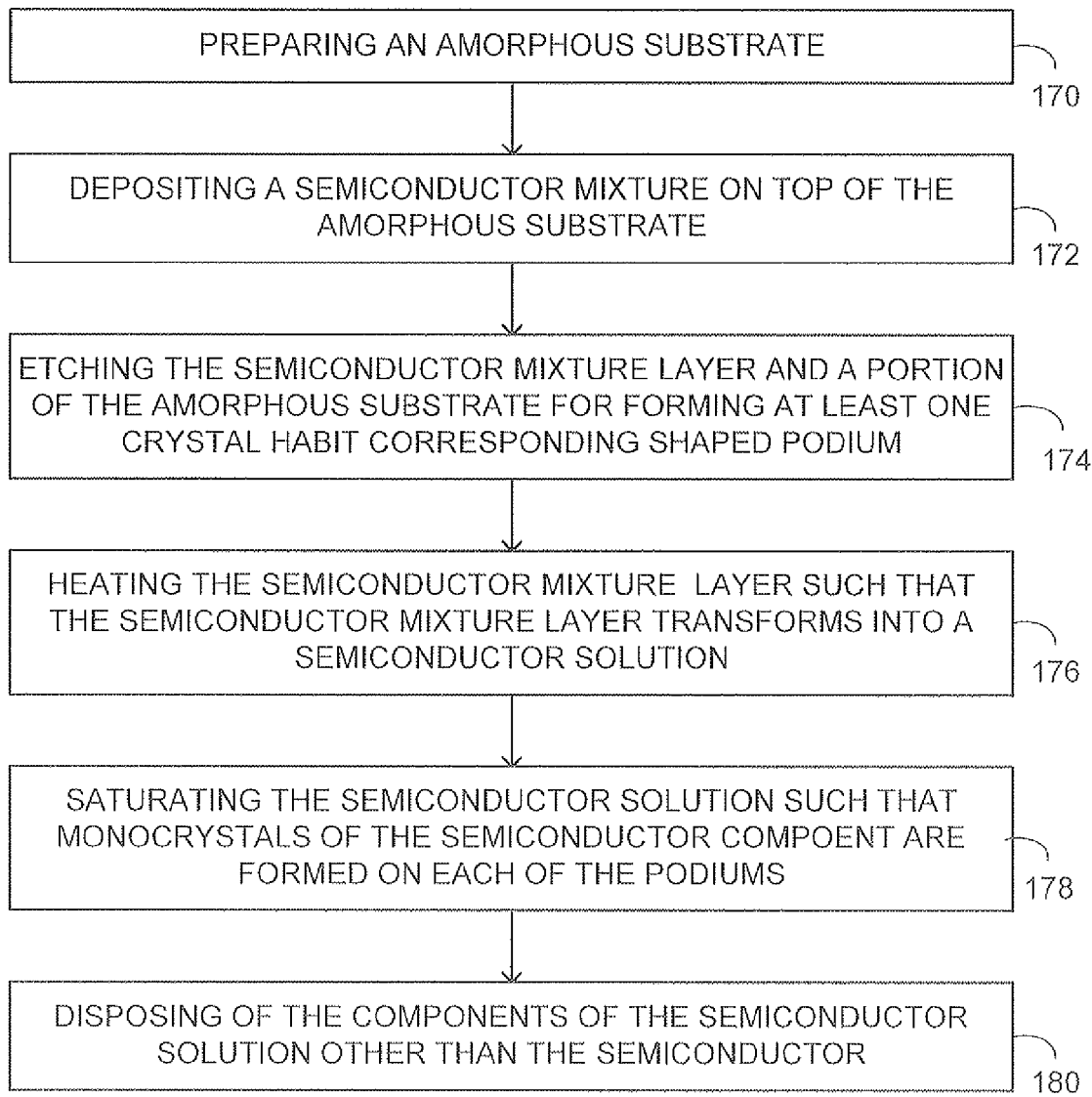
FIG. 3 is a schematic illustration of a method for growing semiconductor micro-crystalline islands on an amorphous layer, operative in accordance with a further embodiment of the disclosed technique.

Reference is now made to FIG. 3, which is a schematic illustration of a method for growing semiconductor microcrystalline islands on an amorphous layer, operative in accordance with a further embodiment of the disclosed technique. In procedure 170, an amorphous substrate is prepared. With reference to FIG. 1A, $SiO_2$ layer 104 is deposited on Si layer 102. It is noted that, $SiO_2$ layer 104 is an amorphous layer of an insulating material.

In procedure 172, a semiconductor-metal mixture is deposited on top of the amorphous substrate. The semiconductor-metal mixture includes a semiconductor component (e.g., silicon) and at least one other metal component (e.g., Tin). With reference to FIG. 1B, layer of Si/Sn mixture 106 is deposited on top of layer of $SiO_2$ 104. In procedure 174, the semiconductor-metal mixture layer and a portion of the amorphous substrate are vertically etched for forming at least one platform (i.e., semiconductor-metal mixture platform), which top surface geometry thereof corresponds to the crystal habit of the semiconductor component. With reference to FIG. 1C, layer of Si/Sn mixture 106 and layer of $SiO_2$ 104 are etched for forming Si/Sn/$SiO_2$ platforms 108.

In procedure 176, the semiconductor-metal mixture layer is heated such that the semiconductor-metal mixture layer is melted. With reference to FIG. 1D, wafer 100 is heated to a temperature of 700° C. The shape of platforms 108, which are composed of a solid mixture of silicon and tin, changes into a liquid droplet having a shape ranging between hemispherical and spherical, while Si/Sn mixture 108 is transformed to Si/Sn solution 108.

In procedure 178, the melted semiconductor-metal mixture (i.e., now a semiconductor solution) is saturated such that monocrystals of the semiconductor component are formed on each of the platforms. With reference to FIG. 1E, Si/Sn melted solution 108 is saturated and Si atoms start to solidify (i.e., crystallize) at the tip of platform 110. Si/Sn melted solution 108 is saturated by employing one of the procedures detailed with reference to FIG. 1E. In procedure 180, the metal components of the semiconductor solution, other than the semiconductor, are disposed of. With reference to FIG. 1F, the solvent Tin which did not evaporate is disposed of by evaporation, by chemical reaction, or by chemically dissolving it with an acidic aqueous solution which do not dissolve the grown crystal. It is noted that, the micro-crystals produced according to the disclosed technique can be doped by diffusion, by ion implantation or by any method known in the art, to produce electronically active material. The micro-crystals can be metalized on the top surface thereof, to produce electrical contacts, and the like. Specifically, one can cover a finished metalized active layer by another amorphous layer and produce another semiconductor active story (i.e., multistory active device structure).

According to another embodiment of the disclosed technique, an example of an application of the microcrystalline semiconductor islands is a Thin Film Transistor of Liquid Crystal Display (TFT LCD). In this embodiment, amorphous and polycrystalline silicon transistors for TFT LCD are replaced with a single crystal transistor (i.e., by producing the crystal according to the disclosed technique, as elaborated above). Generally, the level of performance of a TFT LCD is ranked in a descending order from a higher level in single-crystal silicon transistors, to a lower level in polycrystalline silicon transistors, and an even lower level in amorphous silicon transistors. A circuit layout of TFT LCD, as known in the art, includes transistors fabricated on an amorphous silicon thin film, deposited on a glass panel. Within each pixel, the surface area of the silicon film surrounding the transistor is etched, thus enabling light to pass there-through.

In the present embodiment, a Si/Sn layer is deposited on a glass substrate. The Si/Sn layer is obtained, for example by co-sputtering silicon and tin or by co-evaporation. The Si/Sn layer and a portion of the glass thickness (e.g., 50 nm) are etched for forming tear-drop shaped podiums, leaving the Si/Sn solid mixture on the glass tear-drop shaped podiums. Growth of the microcrystal is initiated at the tip of each tear-drop shaped podium, at the sub-liquidus temperature, as detailed herein above with reference to FIGS. 1A to 1F. Following processes of doping the semiconductor and metallization are substantially similar to procedures known in the art, relating to amorphous silicon and poly-crystalline silicon transistors.

According to a further embodiment of the disclosed technique, an example of an application of the microcrystalline semiconductor islands is flash memory (i.e., a doubly gated MOS transistor). In this example, the first step is executing a known in the art Metal Oxide Semiconductor Field-Effect Transistor (MOSFET) process on a silicon wafer. After metallization of the top layer of the MOSFET, the whole wafer is covered with a silicon dioxide layer. Next, a Si/Sn cold mixture is deposited on the amorphous surface of the silicon dioxide. Applying lithography and etching will produce podiums of the amorphous $SiO_2$, with Si/Sn mixture on-top. Subsequently, the wafer is heated to 700° C. and is soaked in that temperature. Following soaking, reactive (Iodine) gas is applied, which reacts with the Sn. Thus, attaining saturation of the semiconductor-metal solution, and a Si seed is nucleated at the tip of each podium. A flat microcrystal is grown on top of each of the podiums, and the Sn is disposed of, leaving a "clean" silicon crystal. Next, an implantation stop mask is deposited and lithography and etching are applied for creating etched windows in the flat microcrystal. Boron atoms dope the flat microcrystal through the etched windows for forming a p-type layer doped area. Similar process is employed for doping n-type doping sites in the flat microcrystal. An $SiO_2$ gate oxide is grown on top of the flat microcrystal, and a floating gate metal (e.g., Titanium Nitride—TiN) is deposited on-top. The two layers (e.g., $SiO_2$ and TiN) are shaped as a floating gate through lithography and etching. Another couple of layers, of oxide and metal (i.e., substantially similar to the layers of $SiO_2$ and TiN), form the controlling metalized gate. Vias are opened to the underlying metal substrate and metallization lines connect the ports and interconnect the flash memory circuit. A layer of spin-on glass (SiO$_2$) is deposited on top of the flash memory transistor for flattening the active layer. Alternatively, Chemical-Mechanical Planarization (CMP) process can be applied to the wafer. A second active layer can be produced, if the above procedures are repeated for producing a second layer of flash memory transistor on top of the first one.

According to another embodiment of the disclosed technique, yet another example of an application of the microcrystalline semiconductor islands is a photo-transistor circuit. The first step is forming a layer of gallium arsenide microcrystalline islands, and transforming these gallium arsenide micro-crystals into micro-lasers. Next, wave guides are buried in the SiO$_2$ layer. The wave guides are buried by implantation of heavy atoms in an exposed lithographic scheme. The following step is forming a layer of indium antimonite transistors atop the layer of wave guides. The gate region of each of the transistors is located on an end of a wave guide. The transistors are activated by the GaAs micro-lasers through the respective wave guides.

It will be appreciated by persons skilled in the art that the disclosed technique is not limited to what has been particularly shown and described hereinabove. Rather the scope of the disclosed technique is defined only by the claims, which follow.

The invention claimed is:

1. Method for growing islands of semiconductor monocrystals from a solution on an amorphous substrate, the method comprising the procedures of:
  depositing a semiconductor-metal mixture layer having a non-crystalline structure, including a semiconductor component and at least one other metal component, on top of said amorphous substrate;
  applying lithography and etching to said semiconductor-metal mixture layer and a portion of said amorphous substrate for forming at least one platform, said at least one platform having a top view shape corresponding to a crystal growth direction and a habit respective of said semiconductor component;
  heating said amorphous substrate, thereby heating each at least one platform simultaneously until said semiconductor-metal mixture layer of each said at least one platform is melted and becomes a semiconductor-metal solution; and
  saturating said semiconductor-metal solution until a monocrystal of said semiconductor component is formed from said semiconductor-metal solution on each of said at least one platform.

2. The method according to claim 1, wherein said procedure of depositing is performed by employing a technique selected from the group consisting of:
  co-sputtering said semiconductor component and said at least one other metal component; and
  low-substrate temperature co-deposition of said semiconductor component and said at least one other metal component.

3. The method according to claim 1, further comprising the procedure of disposing of said at least one other metal component of said semiconductor-metal solution.

4. The method according to claim 3, wherein said procedure of disposing includes a sub-procedure selected from the group consisting of:
  evaporating said at least one other metal component;
  employing chemical reaction for disposing of said at least one other metal component; and
  chemically dissolving said at least one other metal component with an acidic aqueous solution which does not dissolve said monocrystal.

5. The method according to claim 1, wherein said semiconductor component is selected from the group consisting of:
  glass on ceraminc substrate; and
  silicon;
  germanium;
  silicon carbide;
  silicon germanium;
  mercury iodide;
  zinc oxide;
  zinc sulfide;
  zinc selenide;
  zinc telluride;
  cadmium (VI);
  zinc cadmium (VI);
  gallium arsenide;
  gallium aluminum arsenide;
  gallium phosphide;
  indium phosphide;
  aluminium nitride;
  gallium nitride;
  indium nitride;
  indium gallium nitride;
  indium gallium aluminum nitride;
  gallium antimonide; and
  indium antimonide.

6. The method according to claim 1, wherein said amorphous substrate is selected from the group consisting of:
  silicon-dioxide;
  silicon nitride;
  silicon oxy-nitride;
  indium tin oxide;
  zinc oxide;
  glass;
  glass on metal;
  glass on ceramic substrate; and
  glass on crystal.

7. The method according to claim 1, wherein the thickness of said semiconductor-metal mixture layer equals approximately half of the typical lateral dimension of said semiconductor monocrystal.

8. The method according to claim 1, wherein said procedure of depositing is performed at a temperature below a predetermined temperature at which droplets of said semiconductor-metal mixture layer would form on said substrate.

9. The method according to claim 1, wherein the top surface of said semiconductor-metal mixture layer is substantially smooth for enabling photolithography and etching thereof.

10. The method according to claim 1, wherein the width of each of said at least one semiconductor platform is ranging between 5 nm and 500 nm.

11. The method according to claim 1, wherein said procedure of saturating includes a sub-procedure selected from the group consisting of:
  maintaining said semiconductor-metal solution at a liquidus temperature therefore enabling said at least one other metal component to evaporate;
  cooling said semiconductor-metal solution; and
  disposing of said at least one other metal component by introducing a chemical substance which reacts with said at least one other metal component and the product escapes said solution.

12. The method according to claim 1, further comprising a procedure of preparing said amorphous substrate, before said procedure of depositing.

13. The method according to claim 12, wherein said procedure of preparing is performed by employing a technique selected from the group consisting of:
- thermal oxidation;
- spin-on glass;
- Tetraethyl Orthosilicate (TEOS) Chemical Vapor Deposition (CVD);
- silane and oxygen plasma enhanced CVD; and
- sputtering.

14. The method according to claim 1, wherein said top view shape of said at least one semiconductor-metal mixture platform is selected from the group consisting of:
- a teardrop shape having an acute tip angle; and
- a polygon having a single acute angle and a plurality of obtuse angles.

15. The method according to claim 14, wherein said acute tip angle and said single acute angle are each approximately sixty degrees.

* * * * *